United States Patent [19]

Mayer

[11] 4,081,770
[45] Mar. 28, 1978

[54] CAPACITIVE ELECTRIC FILTER

[76] Inventor: Ferdy Mayer, 18 rue Thiers, 38000 Grenoble, France

[21] Appl. No.: 681,043

[22] Filed: Apr. 28, 1976

Related U.S. Application Data

[63] Continuation-in-part of Ser. No. 628,914, Nov. 5, 1975, abandoned, which is a continuation of Ser. No. 518,729, Oct. 29, 1974, abandoned.

[30] Foreign Application Priority Data

Oct. 29, 1973 France .............................. 73 38507

[51] Int. Cl.² ...................... H03H 7/04; H03H 7/14; H01G 4/32; H01G 1/147
[52] U.S. Cl. ................................... 333/79; 333/70 S; 361/306
[58] Field of Search ............. 333/70 CR, 70 R, 31 A, 333/70 S, 29, 79; 361/271, 301, 302, 303, 306-310, 311-313, 330

[56] References Cited

U.S. PATENT DOCUMENTS

| | | | |
|---|---|---|---|
| 2,537,959 | 1/1951 | Beverly | 333/31 C |
| 2,565,093 | 8/1951 | Robinson et al. | 333/31 C |
| 2,884,605 | 4/1959 | Dubilier | 333/31 C X |
| 3,654,491 | 4/1972 | Earp | 333/29 |

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

An electric filter includes a first conducting strip, a second conducting strip and two dielectric strips. The first and second conducting strips are rolled up together and are separated by the dielectric strips. The filter also includes a first terminal, a second terminal and a third terminal. One end or a point close to it of the first conducting strip is connected to the first terminal and the other end or a point close to it of the first conducting strip is connected to the second terminal so that at least a substantial part of the inductance of the first conducting strip due to its being rolled up is in series with the first and second terminals. The third terminal is connected to the second conducting strip.

3 Claims, 10 Drawing Figures

CAPACITIVE ELECTRIC FILTER

CROSS REFERENCE TO RELATED APPLICATIONS

This application is a continuation-in-part application of Ser. No. 628,914, filed Nov. 5, 1975, now abandoned, which in turn is a streamlined continuation application of Ser. No. 518,729, filed Oct. 29, 1974 now abandoned.

BACKGROUND OF THE INVENTION

1. Field of the Invention

The invention concerns capacitive electric filters, particularly those used against interference, which contain large capacitances.

2. Description of the Prior Art

Most of the known capacitive electric filters are not effective at high frequencies. Actually, the condensers in them, except those with small capacitances, are made from two conducting strips rolled up together, separated by a dielectric and each connected at one of its ends to a terminal. These condensers do not behave like a pure capacity but rather like a capacity, a resistance and an inductance connected in series. The resistance is due to losses in the dielectric as well as the resistance of the conducting strips. The inductance is due to the inductance of the rolled-up conducting strips as well as that of the connections. The result is that though these condensers are effective at low frequencies where they present a capacitive impedance, they are not effective at high frequencies where they present an inductive impedance. Their inefficiency at high frequencies prevents the use at these frequencies of capacitive electric filters.

SUMMARY OF THE INVENTION

The present invention is intended to alleviate this defect by permitting the realization of capacitive electric filters effective at high frequencies.

The foregoing and other objects are attained in accordance with one aspect of the present invention through an electric filter which includes a first conducting strip, a second conducting strip and at least one dielectric strip. The first and second conducting strips are rolled up together and are separated by the dielectric strip or strips. The filter also includes a first terminal, a second terminal and a third terminal. One end or a point close to it (not further than a third of the length) of the first conducting strip is connected to the first terminal and the other end or a point close to it of the first conducting strip is connected to the second terminal so that a substantial part of the inductance of the first conducting strip due to its being rolled up is in series with the first and second terminals. The third terminal is connected to the second conducting strip.

BRIEF DESCRIPTION OF THE DRAWINGS

Other characteristics and advantages of the invention will become evident from the following description of several modes of realization given as illustrative examples and not restrictive in any way. This description will be given with reference to the drawings in which.

DETAILED DESCRIPTION OF THE PREFERRED EMBODIMENTS

Figure 1:
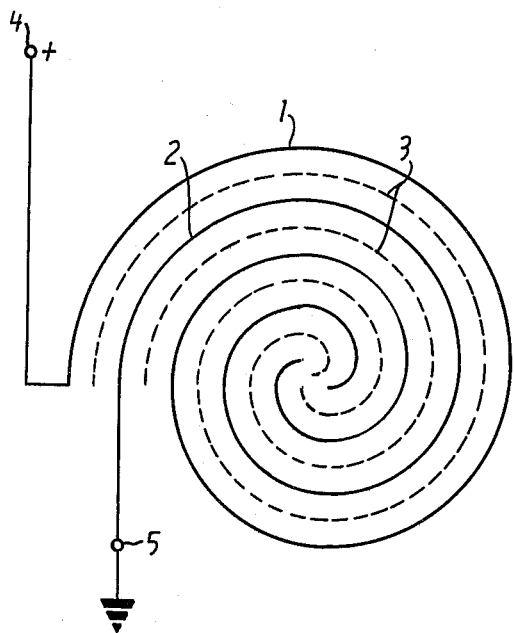
FIG. 1 represents a two-terminal electric filter with a condenser realized by the known method.

Referring now to the drawings, wherein like reference numerals designate identical or corresponding parts throughout the several views, and more particularly to FIG. 1 thereof, FIG. 1 illustrates the prior art. It shows a cross section of a capacitive electric filter formed from an electrolytic condenser connected in parallel between an input-output terminal 4 and ground 5. This electrolytic condenser comprises in a self evident manner two strips of aluminum 1 and 2 rolled together and separated by two paper strips 3 impregnated with electrolyte which not only mechanically separates the aluminum strips 1 and 2, but also assures a low-impedance contact with the strips 1 and 2 and maintain the layer of aluminum oxide constituting the dielectric of the condenser. The electrical connections between the aluminum strips 1 and 2 and the terminals 4 and 5 are made on the outside of the roll as is generally the practice.

It is well known that such a condenser does not behave, from an electrical point of view, like a pure capacity but rather like a capacity, a resistance and an inductance connected in series, the resistance being due to dielectric losses as well as the resistance of the aluminum strips 1 and 2 and the inductance being due to the inductance of the rolled strips and the terminal leads. It has a capacitive impedance at low frequencies and an inductive impedance at high frequencies. The result is that the capacitive electric filter of FIG. 1, which is intended to bypass to ground all the high-frequency components of the electrical signal applied to its input-output terminal 4, is ineffective at the very high frequencies since it behaves like an inductance and presents a high impedance.

Figure 2:
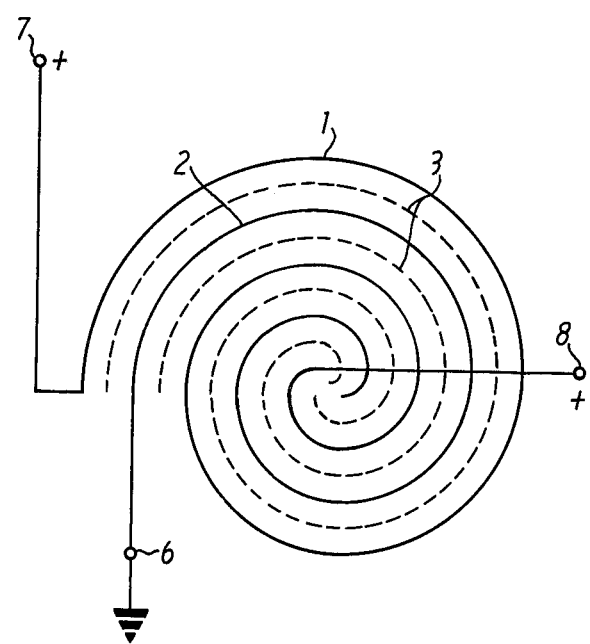
FIG. 2 represents a three-terminal capacitive electrical filter in accordance with the invention.

FIG. 2 shows a capacitive electric filter in accordance with the invention. This filter is also realized starting with an electrolytic condenser comprising two aluminum strips 1 and 2 rolled up together and separated by paper strips 3 impregnated with electrolyte. Each of the aluminum strips 1 and 2 is tied at its outer end to a terminal 7 and 6, respectively. In addition, aluminum strip 1 is connected at its end interior to the roll to a terminal 8. The terminal 6 is connected to ground. Terminals 7 and 8 are the input and output terminals of the capacitive filter. The signal from which it is desired to eliminate the high frequency components is applied to one of the terminals 7 or 8 and is brought out on the other terminal 8 or 7. The aluminum strip 1 has its entire length interposed between the terminals 7 and 8. Compared to the filter shown in FIG. 1, the filter in FIG. 2 has the significant advantage of using the self inductance, due to its being rolled up, as a series impedance between the input and output terminals of the fiter while before, the self inductance, due to the rolling, acted as a parallel impedance between ground and the input-output terminal of the filter. The self inductance due to the rolling of the condenser, instead of opposing the shunting to ground of the high frequency components of the signal applied to the filter, now opposes the transmission of these high freuencies to the filter outut. Thus, good operation of the filter is no longer opposed but rather is aided. This filter can be put in a cylindrical jacket having a conducting lateral wall serving as ground terminal 6 with the leads 7 and 8 each projecting axially from an end of this jacket.

Figure 3:
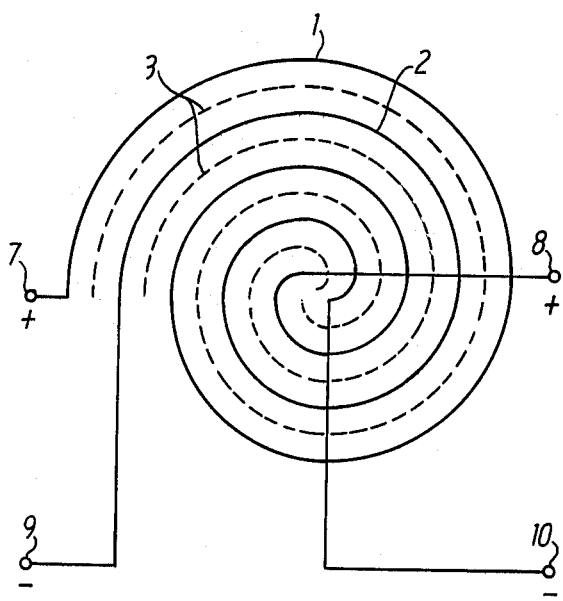
FIG. 3 represents a four-terminal capacitive electric filter in accordance with the invention.

FIG. 3 shows another capacitive filter in accordance with the invention. This filter is also realized starting with an electrolytic condenser comprising two aluminum strips 1 and 2 rolled up together and separated by two paper strips 3 impregnated with electrolyte. Each of the aluminum strips 1 and 2 is tied at its end exterior to the roll, to a terminal 7 and 9, respectively. In addition, each of the aluminum strips 1 and 2 is tied at its interior end to a terminal 8 and 10, respectively. Each of the aluminum strips 1 and 2 is interposed between the input and output terminals 7 and 8, and 9 and 10, respectively. The electrical signal from which it is desired to eliminate the high frequency components is applied between the terminals 7 and 9 or 8 and 10 and is brought out on the remaining terminals 8 and 10 or 7 and 9.

Figure 4:
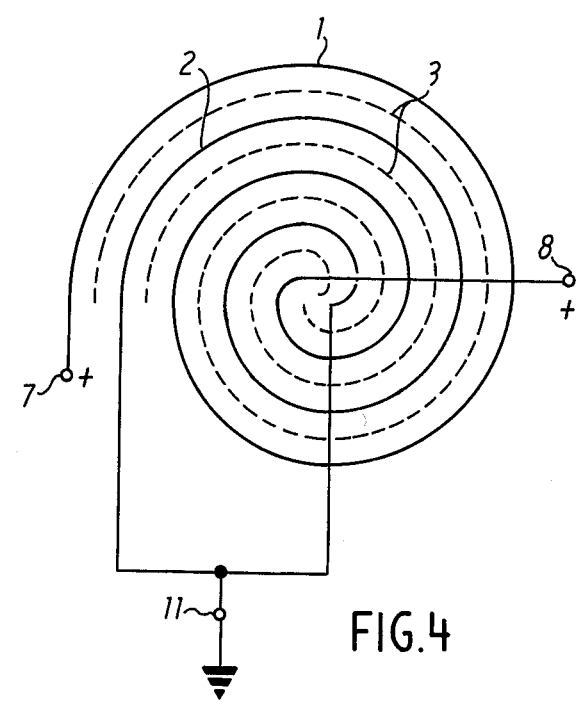
FIG. 4 represents the four-terminal capacitive electric filter of FIG. 3 used as a three-terminal filter.

FIG. 4 shows the same capacitive filter as FIG. 3 in which the terminals 9 and 10 are tied to a signal terminal 11 with the filter connected to ground with a view to using a three-terminal configuration.

Figure 5:
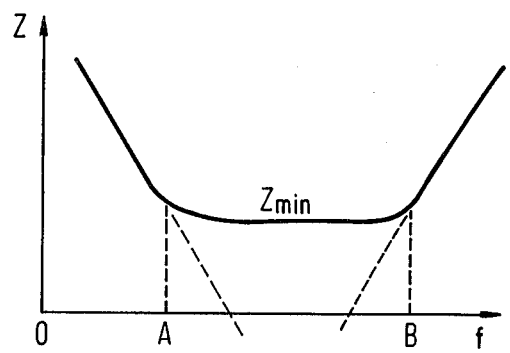
FIG. 5 shows the relationship between impedance and frequency for the condenser of FIG. 1.

FIG. 5 illustrates the impedance of a condenser such as the one of FIG. 1 between terminal 4 and terminal 5.

Figure 7:
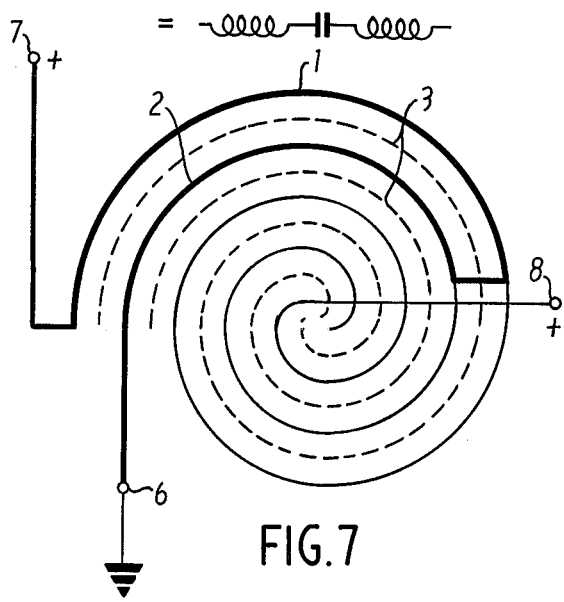
FIG. 7 shows the current path for the condenser of FIG. 2 and its electrical equivalent.

For the first part of the curve, between O and A (about 0.1 MHz), such a rolled condenser behaves exactly as an ordinary condenser. At low frequencies, the impedance is not increased by the turns of the electrodes, the current following the following path as shown in FIG. 7: a distance in the first electrode 1, from the first electrode to the second electrode across the dielectric 3 and a distance in the reverse direction through the second electrode 2.

Thus, in the first part O–A of FIG. 5 (between 0 and 0.1 MHz), the filter of FIG. 2 acts as a mere condenser because at low frequencies the impedance of a condenser is preponderant. With increasing frequencies, the impedance of the condenser is reduced and arrives at a minimum at point A.

Between points A and B, in the second part, between 0.1 and 1 MHz, the impedance of the condenser is small and the self-inductance impedance is not an important factor. A more important factor is the ohmic resistance because the electrodes 1 and 2 are very thin and the path in the rolled sheets of aluminum can be quite long.

Figure 6:
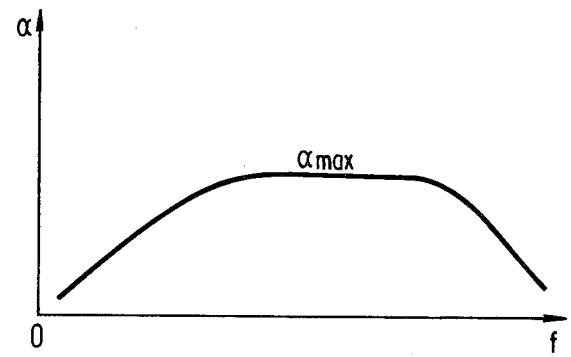
FIG. 6 shows the relationship between α and frequency for the condenser of FIG. 1.

In the third part, after B, the impedance z increases due to the self inductance effect. The qualities of the filter are determined by the value Z min over the largest range of frequencies ($\alpha$ max as shown in FIG. 6). $\alpha$ is the attenuation in decibels in usual standards (MIL Standards) with the insertion of the filter in a usual attenuation measuring device, (with a generator impedance and a load impedance of 50 $\Omega$). It represents the RFI insertion loss by such a capacitor in a typical circuit (with a load impedance).

An aim of the invention is to increase $\alpha$ at the maximum and to extend the flat part of the curve of FIG. 6 over the longest range, i.e., a maximum of attenuation for the highest frequencies. In practice, the frequency corresponding to B, may be extended to 100 or 1000 MHz.

The value of Z min, between A and B, is essentially resistive and is the sum of two parts, $R_{AC}$ and $R_{DC}$. For volume-efficient condensers, with very thin and very long foils which are rolled up, $R_{DC}$ can become important, if not preponderant. Indeed, the resistance of the metallic strips may exceed the resistance of the electrolytical layer. Practical values of $R_{AC} + R_{DC}$ comprises between 0.1$\Omega$ and 0.001$\Omega$ for condenser of value between 100 ad 1000 $\mu$f. These values limit attenuation in the mid frequency range to approximately 45 to 100 db.

Figure 8:
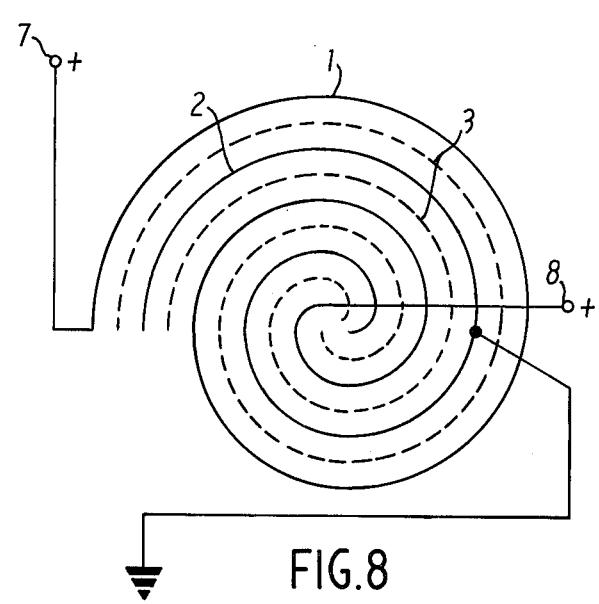
FIG. 8 shows a preferred embodiment wherein the middle section of a conducting strip is grounded.
Figure 9:
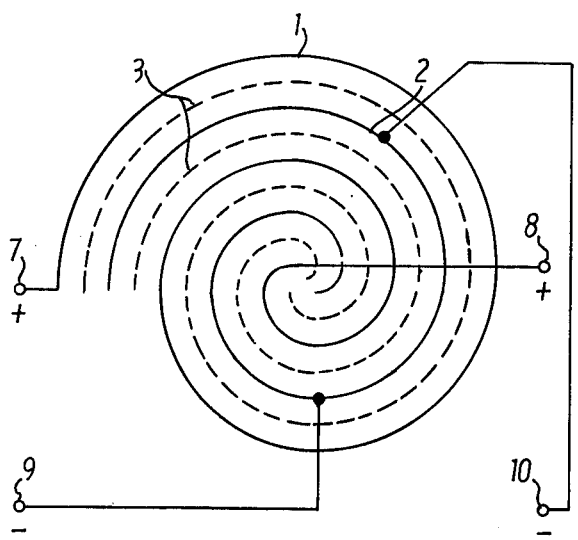
FIGS. 9 and 10 show preferred embodiments wherein a conducting strip is contacted at multiple points.
Figure 10:
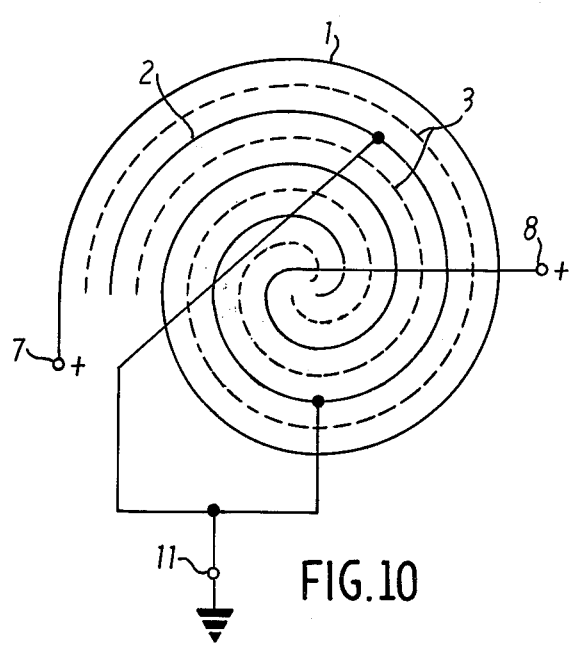

With reference to the embodiment shown in FIG. 4, it is clear that the most favorable connections to ground 11 are not at the ends of the rolled sheet: the embodiment which halves $R_{DC}$ and $R_{AC}$ and thereby divides ohmic (Joule) losses by four. It is easy to see that there are optimum connecting points depending on their number. A preferred solution according to the present invention is illustrated in FIGS. 8–10. As shown in FIG. 8, one ground electrode is connected near the middle of aluminum strip 2, which minimized $R_{DC}$ and $R_{AC}$. This realizes a T-type three-pole filter with distributed capacitance. As shown in FIG. 9 which corresponds to FIG. 3, terminals 9 and 10 contact aluminum strip 2 at two points between one fifth and one third from the respective ends of aluminum strip 2 forming two ground connections. This realizes a double T-type four-pole filter with a minimum value of $R_{DC} + R_{AC}$ which is better than the half value described. In a similar manner, optimum locations can be determined easily for more than two ground connections. As shown in FIG. 10, terminal 11 contacts aluminum strip 2 at two points along its length (several points may, however, be used). Terminal 11 is connected at two points between zero and one third from the ends of aluminum strip 2. This corresponds to a TT-type three-pole filter where Joule effect losses are reduced at the expense of a smaller active series inductance.

In another preferable solution according to the present invention, intermediary connections to both strips 1 and 2 may be used optimizing $R_{DC} + R_{AC}$ and RFI-performance $\alpha$.

In U.S. Pat. No. 3,141,145, one electrode 16 is connected to ground along its whole length. However, in this case, there is no self inductance effect because all the turns of electrode 16 are short circuited. Therefore, the current travels in the width of the rolled strip 16, and, as is apparent from FIG. 2 of this patent, there is no self inductance effect on the side of electrode 16. Further, the process of melting the side of a rolled strip in a continuous contacting mass is quite complicated and expensive. It is ordinarily used only in flat condensers, where no electrode can present a self inductance effect.

The choice of the one or several optimum contact points according to the invention can be realized with ordinary processes, and, in particular, can be realized on automatic machines of the same type as those producing rolled capacitors.

Such a condenser can be mass manufactured inexpensively and is quite suitable for use for brute force filtering where series Joule effect losses (responsible for the heating of the flter by direct or low-frequency current) and low transfer impedance (responsible for the RFI-attenuation of the filter) have to be optimized.

The capacitive filters described can be made in different ways as suggested above. Indeed, many intermediary realizations from the T-type filter (FIG. 8) to the $\pi$ -type filter (FIG. 10) going through multiple T or $\pi$ configurations (FIGS. 7 and 10) are possible and capable of being optimized taking into account for a given volume manufacturing complexity; i.e. price
  value of low frequency current; i.e. heating effects
  RFI-performance in a given circuit or as a brute-force filter; i.e. max attenuation with given or variable interfaces.

These optimizations are within the state of the art.

Capacitive filters comprising an electrolytic capacitor have just been described, but it is clear that any type of rolled condenser could be used, including classical non-electrolytic condensers. Moreover, one could also use rolled capacitor structures having more than two rolled-up conducting strips separated by a dielectric, one or more of them having their ends tied to input and output terminals.

The capacitive filters just described can be used without restriction over the whole range of electric filters. But their use is particularly advantageous for interference suppression, i.e. as brute-force filters for variable and varying interfaces.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. An electric filter comprising:
  a first conducting strip,
  a second conducting strip,
  a first dielectric strip,
  a second dielectric strip,
  the first and second conducting strips being rolled up together and separated by the dielectric strips, the first conducting strip overlapping the same width of the second conducting strip throughout,
  a first terminal,
  a second terminal,
  a third terminal,
  one end or a point close to it of the first conducting strip being connected to the first terminal and the other end or a point close to it of the first conducting strip being connected to the second terminal so that a substantial part of the inductance of the first conducting strip due to its being rolled up is in series with the first and second terminals,
  the third terminal being connected to the second conducting strip at one point substantially at the middle of the second conducting strip.

2. An electric filter comprising:
  a first conducting strip,
  a second conducting strip,
  a first dielectric strip,
  a second dielectric strip,
  the first and second conducting strips being rolled up together and separated by the dielectric strips, the first conducting strip overlapping the same width of the second conducting strip throughout,
  a first terminal,
  a second terminal,
  a third terminal, one end or a point close to it of the first conducting strip being connected to the first terminal and the other end or a point close to it of the first conducting strip being connected to the second terminal so that a substantial part of the inductance of the first conducting strip due to its being rolled up is in series with the first and second terminals,
  the third terminal being connected to the second conducting strip at two points between one-fifth and one-third from the respective ends of the second conducting strip.

3. An electric filter comprising:
  a first conducting strip,
  a second conducting strip,
  a first dielectric strip,
  a second dielectric strip,
  the first and second conducting strips being rolled up together and separated by the dielectric strips, the first conducting strip overlapping the same width of the second conducting strip throughout,
  a first terminal,
  a second terminal,
  a third terminal,
  one end or a point close to it of the first conducting strip being connected to the first terminal and the other end or a point close to it of the first conducting strip being connected to the second terminal so that a substantial part of the inductance of the first conducting strip due to its being rolled up is in series with the first and second terminals,
  the third terminal being connected to the second conducting strip at multiple points to optimize low frequency and high frequency equivalent resisitance.

* * * * *